US012696479B2

(12) United States Patent
Tanaka et al.

(10) Patent No.: US 12,696,479 B2
(45) Date of Patent: Jul. 28, 2026

(54) SEMICONDUCTOR DEVICE

(71) Applicants: Kabushiki Kaisha Toshiba, Tokyo
(JP); Toshiba Electronic Devices &
Storage Corporation, Tokyo (JP)

(72) Inventors: Katsuhisa Tanaka, Himeji Hyogo (JP);
Hiroshi Kono, Himeji Hyogo (JP)

(73) Assignees: Kabushiki Kaisha Toshiba, Kawasaki
(JP); Toshiba Electronic Devices &
Storage Corporation, Kawasaki (JP)

( * ) Notice: Subject to any disclaimer, the term of this
patent is extended or adjusted under 35
U.S.C. 154(b) by 331 days.

(21) Appl. No.: 18/463,124

(22) Filed: Sep. 7, 2023

(65) Prior Publication Data

US 2024/0313109 A1     Sep. 19, 2024

(30) Foreign Application Priority Data

Mar. 17, 2023     (JP) ................................. 2023-043221

(51) Int. Cl.
H10D 30/66          (2025.01)
H10D 62/10          (2025.01)
(Continued)

(52) U.S. Cl.
CPC ......... H10D 30/665 (2025.01); H10D 30/668
(2025.01); H10D 62/111 (2025.01); H10D
64/111 (2025.01); *H10D 62/8325* (2025.01)

(58) Field of Classification Search
CPC .. H10D 30/665; H10D 62/111; H10D 64/111;
H10D 30/668; H10D 62/8325
See application file for complete search history.

(56) References Cited

U.S. PATENT DOCUMENTS 9,825,164 B2     11/2017  Kagawa et al.
10,468,496 B2    11/2019  Hisada et al.
(Continued)

FOREIGN PATENT DOCUMENTS

JP          2002222949 A     8/2002
JP          2019-102726 A     6/2019
(Continued)

OTHER PUBLICATIONS

Notice of Reasons for Refusal (Office Action) dated Mar. 6, 2026,
mailed in counterpart Japanese Patent Application No. 2023-
043221, with English machine translation, 9 pages.

*Primary Examiner* — Christine A Enad
(74) *Attorney, Agent, or Firm* — Kim & Stewart LLP

(57)          ABSTRACT
According to one embodiment, a semiconductor device
includes a first electrode, a first semiconductor region of a
first conductivity type, a second semiconductor region of a
second conductivity type, a third semiconductor region of
the first conductivity type, a gate electrode, a fourth semi-
conductor region of the second conductivity type, a fifth
semiconductor region of the second conductivity type, a
sixth semiconductor region of the second conductivity type,
a seventh semiconductor region of the second conductivity
type, an eighth semiconductor region of the second conduc-
tivity type, a second electrode, and a third electrode. The
fourth semiconductor region is located around the second
semiconductor region and the gate electrode. The fourth,
fifth and sixth semiconductor regions are separated from
each other. The fourth, seventh and eighth semiconductor
regions are separated from each other. The third electrode is
located on the eighth semiconductor region with an insulat-
ing layer interposed.

14 Claims, 9 Drawing Sheets

(51) Int. Cl.
    *H10D 62/832*        (2025.01)
    *H10D 64/00*         (2025.01)

(56)            References Cited

U.S. PATENT DOCUMENTS

| | | | |
|---|---|---|---|
| 11,049,964 | B2 | 6/2021 | Araoka |
| 2002/0096715 | A1 | 7/2002 | Sumida et al. |
| 2019/0288106 | A1 | 9/2019 | Uchida et al. |
| 2020/0091139 | A1* | 3/2020 | Iwamizu ............... H01L 23/482 |
| 2020/0328301 | A1* | 10/2020 | Araoka ............. H10D 62/8325 |
| 2022/0005928 | A1 | 1/2022 | Takeuchi et al. |
| 2022/0013666 | A1 | 1/2022 | Urakami et al. |

FOREIGN PATENT DOCUMENTS

| | | | |
|---|---|---|---|
| JP | 2020-113633 | A | 7/2020 |
| JP | 2020-167178 | A | 10/2020 |
| JP | 2020177955 | A | 10/2020 |
| JP | 2021-119639 | A | 8/2021 |
| JP | 2022-151776 | A | 10/2022 |
| JP | 2022-175975 | A | 11/2022 |
| JP | 2023-010376 | A | 1/2023 |

* cited by examiner

SEMICONDUCTOR DEVICE

CROSS-REFERENCE TO RELATED APPLICATIONS

This application is based upon and claims the benefit of priority from Japanese Patent Application No. 2023-043221, filed on Mar. 17, 2023; the entire contents of which are incorporated herein by reference.

FIELD

Embodiments of the invention generally relate to a semiconductor device.

BACKGROUND

Semiconductor devices such as metal oxide semiconductor field effect transistors (MOSFETs) and the like are used in power conversion and other applications. MOSFETs have built-in parasitic diodes. Technology that can suppress breakdown of semiconductor devices when parasitic diodes operate is desirable.

DETAILED DESCRIPTION

Figure 1:
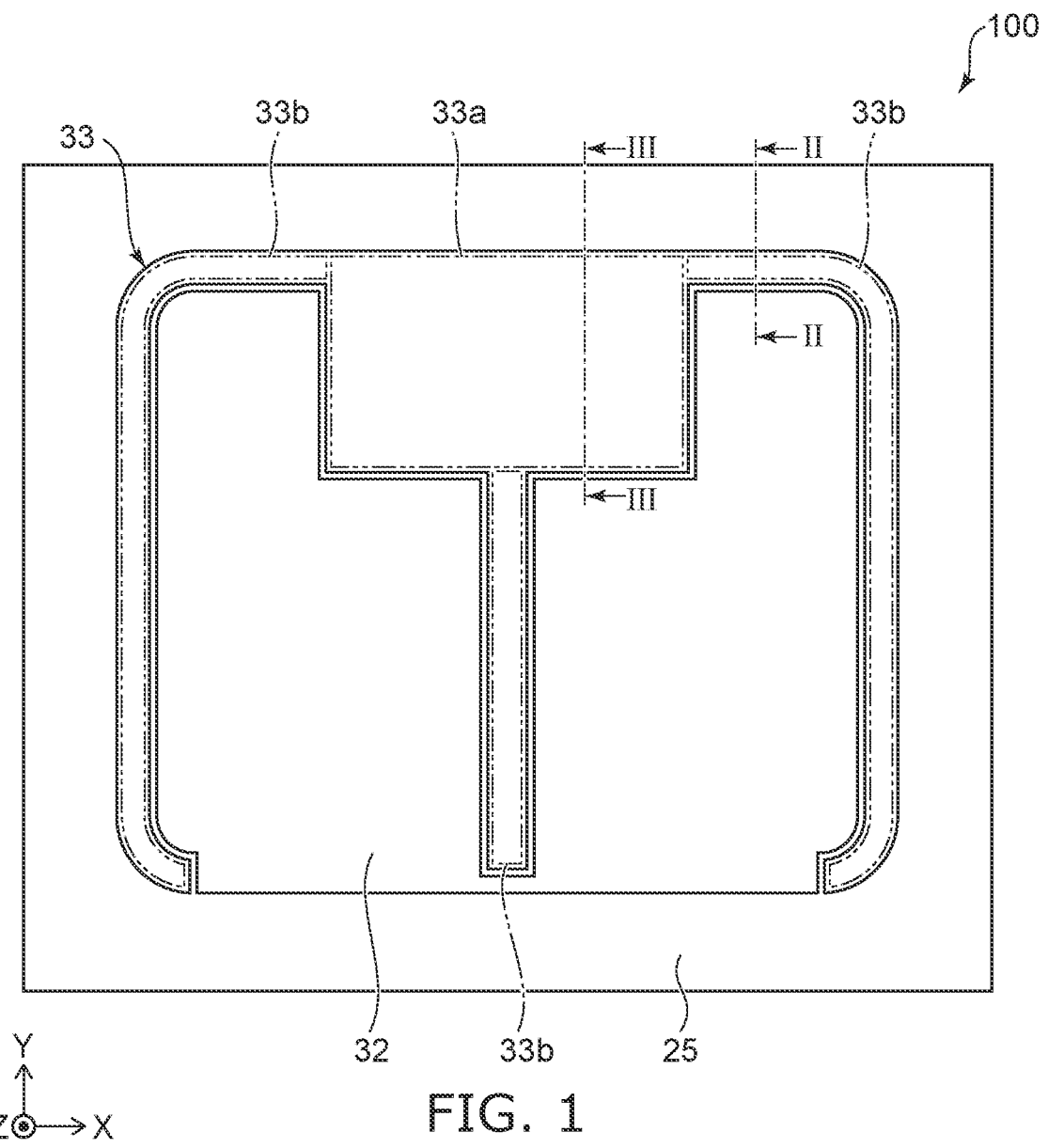
FIG. 1 is a plan view showing a semiconductor device according to an embodiment.

According to one embodiment, a semiconductor device includes a first electrode, a first semiconductor region of a first conductivity type, a second semiconductor region of a second conductivity type, a third semiconductor region of the first conductivity type, a gate electrode, a fourth semiconductor region of the second conductivity type, a fifth semiconductor region of the second conductivity type, a sixth semiconductor region of the second conductivity type, a seventh semiconductor region of the second conductivity type, an eighth semiconductor region of the second conductivity type, a second electrode, and a third electrode. The first semiconductor region is located on the first electrode. The first semiconductor region includes a first part, and a second part located around the first part along a first plane perpendicular to a first direction that is from the first electrode toward the first semiconductor region. The second semiconductor region is located on the first part. The third semiconductor region is located on the second semiconductor region. The gate electrode faces the second semiconductor region via a gate insulating layer in a second direction perpendicular to the first direction. The fourth semiconductor region is located around the second semiconductor region and the gate electrode along the first plane on the first part. A lower end of the fourth semiconductor region is positioned deeper than a lower end of the second semiconductor region. The fifth semiconductor region is positioned on the second part and located around a portion of the fourth semiconductor region along the first plane. The sixth semiconductor region is located between the fifth semiconductor region and the portion of the fourth semiconductor region, and is separated from the fourth and fifth semiconductor regions. The seventh semiconductor region is positioned higher than the fifth semiconductor region and located around an other portion of the fourth semiconductor region along the first plane. The seventh semiconductor region is separated from the fifth semiconductor region. The eighth semiconductor region is located between the seventh semiconductor region and the other portion of the fourth semiconductor region. The eighth semiconductor region is separated from the fourth, sixth, and seventh semiconductor regions. The second electrode is located on the second, third, and fourth semiconductor regions. The third electrode is located on the eighth semiconductor region with an insulating layer interposed. The third electrode is separated from the second electrode and electrically connected with the gate electrode.

Various embodiments will be described hereinafter with reference to the accompanying drawings. The drawings are schematic and conceptual; and the relationships between the thickness and width of portions, the proportions of sizes among portions, etc., are not necessarily the same as the actual values thereof. Further, the dimensions and proportions may be illustrated differently among drawings, even for identical portions. In the specification and drawings, components similar to those described or illustrated in a drawing thereinabove are marked with like reference numerals, and a detailed description is omitted as appropriate.

In the following description, the notation "n$^+$" and "n$^-$" and the notation "p$^+$" and "p$^-$" represent the relative levels of impurity concentrations of the conductivity types. Specifically, the notation "n$^+$" indicates that the n-type impurity concentration is relatively higher than the notation "n", and the notation "n$^-$" indicates that the n-type impurity concentration is relatively lower than the notation "n". The notation "p$^+$" indicates that the p-type impurity concentration is relatively higher than notation "p", and the notation "p$^-$" indicates that the p-type impurity concentration is relatively lower than the notation "p".

The embodiments described below may be carried out with the p-type and the n-type of the semiconductor regions inverted.

Figure 2:
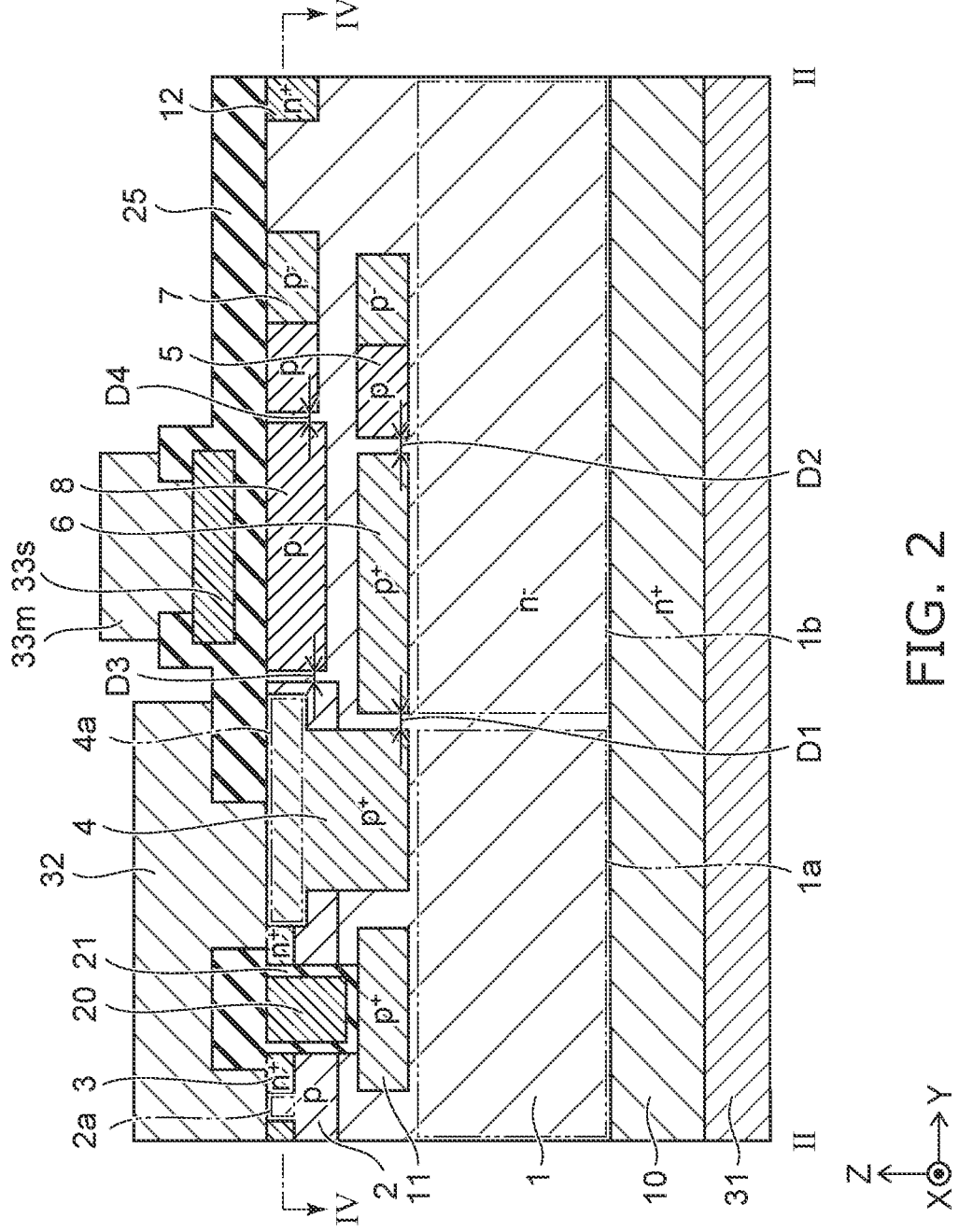
FIG. 2 is a II-II cross-sectional view of FIG. 1.
Figure 3:
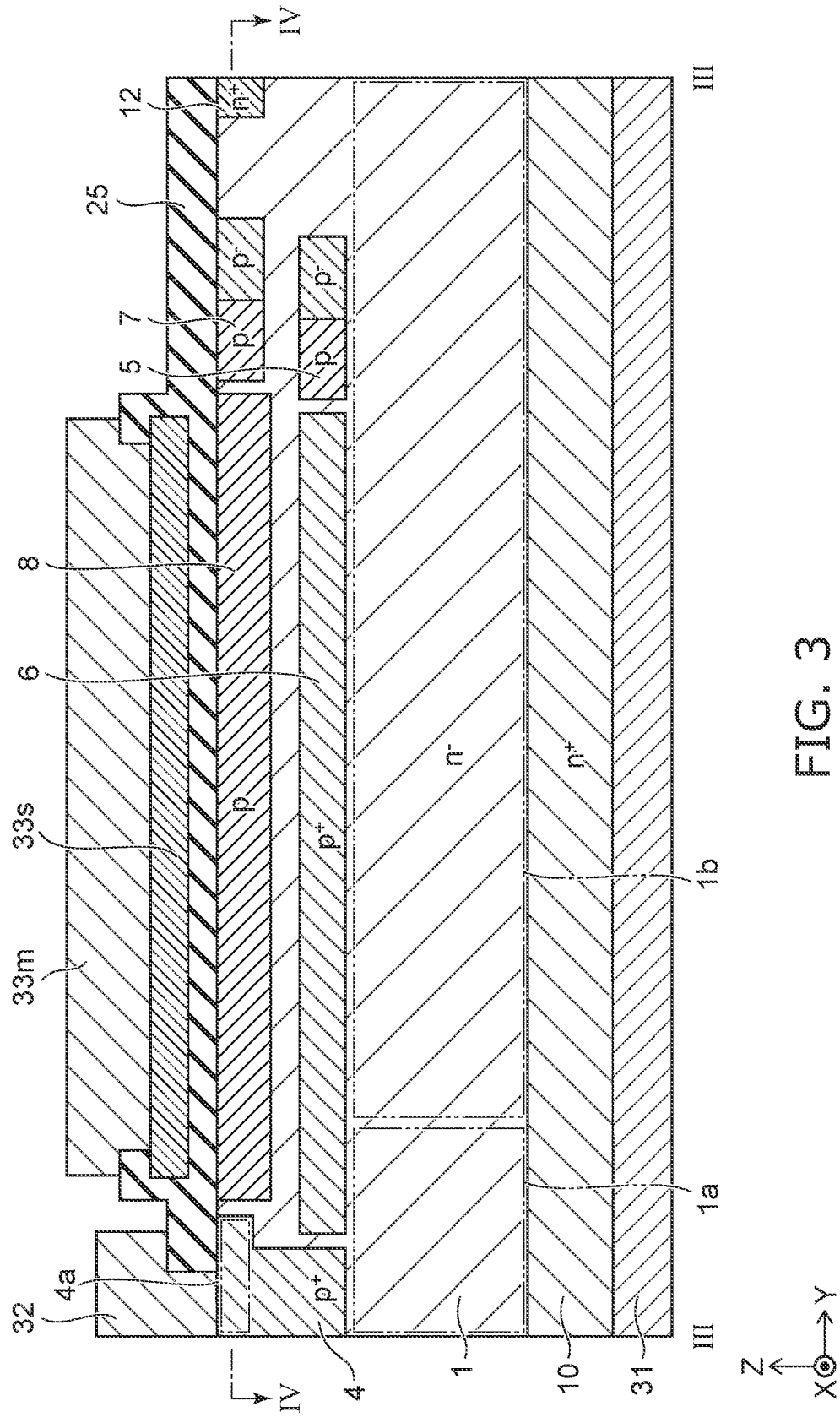
FIG. 3 is a III-III cross-sectional view of FIG. 1.

FIG. 1 is a plan view showing a semiconductor device according to an embodiment. FIG. 2 is a II-II cross-sectional view of FIG. 1. FIG. 3 is a III-III cross-sectional view of FIG. 1.

The semiconductor device according to the embodiment is a MOSFET. As shown in FIGS. 1 to 3, the semiconductor device 100 according to the embodiment includes an n$^-$-type drift region 1, a p-type base region 2, an n$^+$-type source region 3, a p$^+$-type semiconductor region 4, a p-type RESURF region 5, a p$^+$-type relaxation region 6, a p-type RESURF region 7, a p-type relaxation region 8, an n$^+$-type drain region 10, a p$^+$-type semiconductor region 11, an n$^+$-type channel stopper region 12, a gate electrode 20, an insulating layer 25, a first electrode 31, a second electrode 32, and a third electrode 33.

An XYZ orthogonal coordinate system is used in the description of embodiments. A direction from the first electrode 31 toward the n$^-$-type drift region 1 is taken as a Z-direction (a first direction). Two mutually-orthogonal directions perpendicular to the Z-direction are taken as an X-direction (a third direction) and a Y-direction (a second direction). In the description, the direction from the first electrode 31 toward the n⁻-type drift region 1 is called "up", and the opposite direction is called "down". These directions are based on the relative positional relationship between the first electrode 31 and the n⁻-type drift region 1 and are independent of the direction of gravity.

As shown in FIG. 1, the second electrode 32 and the third electrode 33 are located at the upper surface of the semiconductor device 100. The second electrode 32 and the third electrode 33 are separated from each other. The outer perimeter of the upper surface of the semiconductor device 100 is covered with the insulating layer 25.

The third electrode 33 includes a pad part 33a and a wiring part 33b. The pad part 33a and the wiring part 33b are illustrated by double dot-dash lines in FIG. 1. An external terminal is connected to the pad part 33a. The wiring part 33b is located at the periphery of the second electrode 32 or between portions of the second electrode 32. Each wiring part 33b includes a portion extending in the Y-direction. The second electrode 32 is positioned between the wiring parts 33b in the X-direction. The X-direction length of the pad part 33a is greater than the X-direction length of the portion of the wiring part 33b extending in the Y-direction.

As shown in FIGS. 2 and 3, the first electrode 31 is located at the lower surface of the semiconductor device 100. The n⁺-type drain region 10 is located on the first electrode 31 and is electrically connected with the first electrode 31.

The n⁻-type drift region 1 is located on the n⁺-type drain region 10. The n⁻-type impurity concentration of the n⁻-type drift region 1 is less than the n-type impurity concentration of the n⁺-type drain region 10. The n⁻-type drift region 1 includes a first part 1a and a second part 1b. The second part 1b is located around the first part 1a along the X-Y plane (a first plane). The first part 1a is positioned at the central portion of the semiconductor device 100, and is the region through which the current mainly flows in the on-state. The second part 1b is positioned at the outer perimeter portion of the semiconductor device 100, and is a region in which a depletion layer spreads when the semiconductor device 100 is in the off-state.

The p-type base region 2 is located on the first part 1a. The n⁺-type source region 3 is located on the p-type base region 2. The p-type base region 2 includes a contact portion 2a arranged with the n⁺-type source region 3 in the Y-direction. The contact portion 2a is illustrated by a double dot-dash line in FIGS. 2 and 3. The p-type impurity concentration of the contact portion 2a is greater than the p-type impurity concentration of the other portions of the p-type base region 2. The gate electrode 20 faces the p-type base region 2 via a gate insulating layer 21 in the Y-direction.

The p⁺-type semiconductor region 4 is located on the first part 1a and is positioned around the p-type base region 2, the n⁺-type source region 3, and the gate electrode 20 along the X-Y plane. The lower end of the p⁺-type semiconductor region 4 is positioned lower than the lower end of the p-type base region 2 and the lower end of the gate electrode 20. A contact portion 4a is provided in the upper portion of the p⁺-type semiconductor region 4. The contact portion 4a is illustrated by a double dot-dash line in FIGS. 2 and 3. The p-type impurity concentration of the contact portion 4a is greater than the p-type impurity concentration of the other portions of the p⁺-type semiconductor region 4.

The p-type RESURF region 5 is located around the lower portion of the p⁺-type semiconductor region 4 along the X-Y plane and is positioned on the second part 1b. The p-type RESURF region 5 is separated from the p⁺-type semiconductor region 4. The p⁺-type relaxation region 6 is located between the p⁺-type semiconductor region 4 and the p-type RESURF region 5 and is separated from the p⁺-type semiconductor region 4 and the p-type RESURF region 5.

The p-type impurity concentration of the p⁺-type relaxation region 6 is greater than the p-type impurity concentration of the p-type RESURF region 5. The p-type RESURF region 5 may have a p-type impurity concentration gradient in a direction from the center toward the outer perimeter of the semiconductor device 100. The p-type impurity concentration of the p⁺-type relaxation region 6 may be equal to or less than the p-type impurity concentration of the lower portion of the p⁺-type semiconductor region 4.

The p-type RESURF region 7 is located around the upper portion (the contact portion 4a) of the p⁺-type semiconductor region 4 along the X-Y plane and is separated from the p⁺-type semiconductor region 4. The p-type relaxation region 8 is located between the p⁺-type semiconductor region 4 and the p-type RESURF region 7 and is separated from the p⁺-type semiconductor region 4 and the p-type RESURF region 7. The p-type RESURF region 7 and the p-type relaxation region 8 are positioned higher than the p-type RESURF region 5 and the p⁺-type relaxation region 6 and are separated from the p-type RESURF region 5 and the p⁺-type relaxation region 6. A portion of the n⁻-type drift region 1 exists between the p⁺-type semiconductor region 4, the p-type RESURF region 5, the p⁺-type relaxation region 6, the p-type RESURF region 7, and the p-type relaxation region 8.

The p-type RESURF region 7 has a p-type impurity concentration gradient in a direction from the center toward the outer perimeter of the semiconductor device 100. The p-type impurity concentration of the p-type relaxation region 8 may be equal to or greater than the p-type impurity concentration at the inner side of the p-type RESURF region 7. The p-type impurity concentration of the p-type relaxation region 8 is less than the p-type impurity concentration of the p⁺-type semiconductor region 4.

The p⁺-type semiconductor region 11 is located between the first part 1a and the gate electrode 20 in the Z-direction. The n⁺-type channel stopper region 12 is located at the periphery of the p-type RESURF region 7 along the X-Y plane. The n⁺-type channel stopper region 12 is separated from the p-type RESURF region 7 and positioned along the outer perimeter of the semiconductor device 100. The n-type impurity concentration of the n⁺-type channel stopper region 12 is greater than the n-type impurity concentration of the n⁻-type drift region 1.

The second electrode 32 is located on the p-type base region 2, the n⁺-type source region 3, the p⁺-type semiconductor region 4, and the gate electrode 20. The second electrode 32 contacts the contact portion 2a, the n⁺-type source region 3, and the contact portion 4a and is electrically connected with the p-type base region 2, the n⁺-type source region 3, and the p⁺-type semiconductor region 4. The insulating layer 25 is positioned between the gate electrode 20 and the second electrode 32; and the gate electrode 20 and the second electrode 32 are electrically isolated from each other.

The pad part 33a and the wiring part 33b of the third electrode 33 are located on the p-type relaxation region 8 with the insulating layer 25 interposed. As illustrated, the pad part 33a and the wiring part 33b each may include a semiconductor layer 33s and a metal layer 33m. The metal layer 33m is located on the semiconductor layer 33s.

Figure 4:
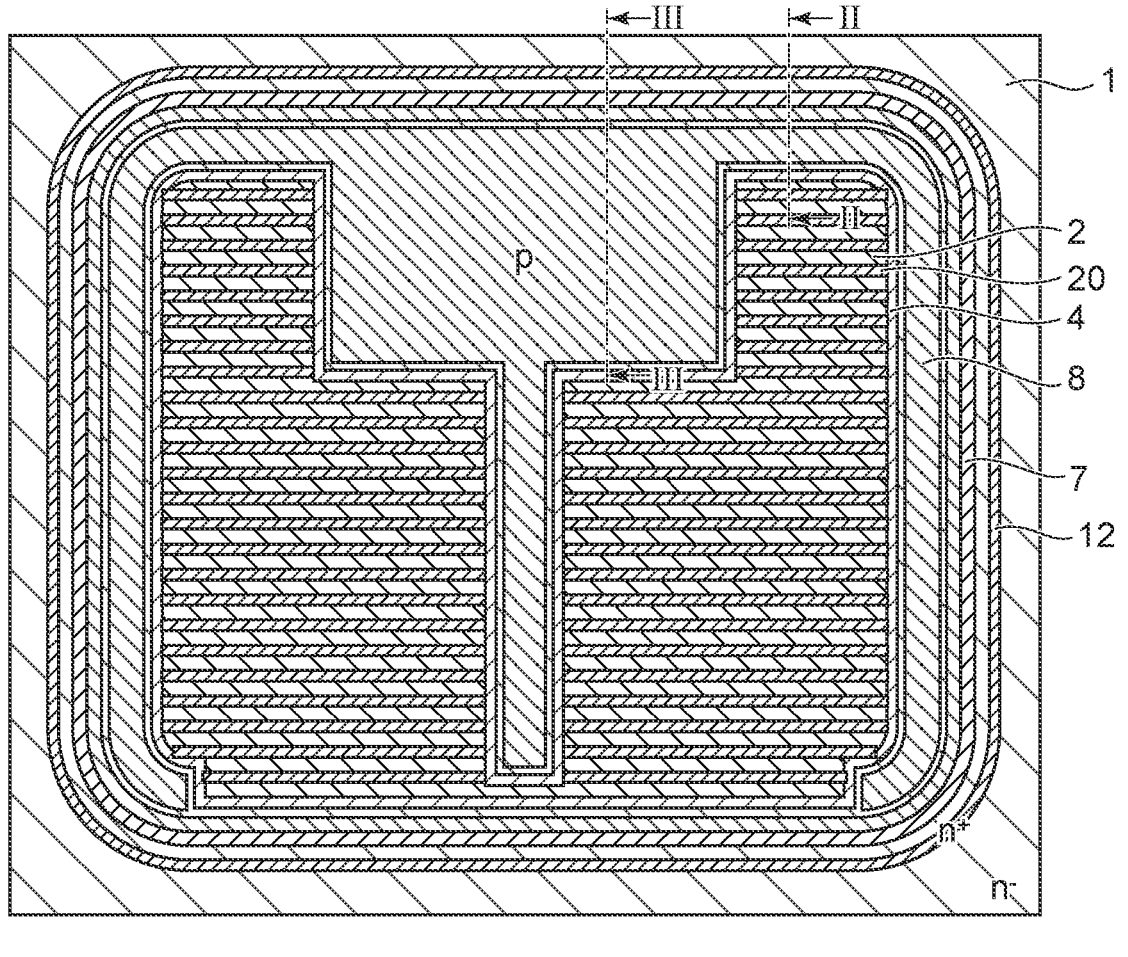
FIG. 4 is a plan view showing the semiconductor device according to the embodiment.

FIG. 4 is a plan view showing the semiconductor device according to the embodiment. FIG. 4 corresponds to the IV-IV cross-sectional view of FIGS. 2 and 3. The n$^+$-type source region 3 and the gate insulating layer 21 are not illustrated in FIG. 4.

As shown in FIGS. 2 and 4, multiple p-type base regions 2, multiple n$^+$-type source regions 3, and multiple gate electrodes 20 are arranged in the Y-direction on the first part 1$a$. Each p-type base region 2, each n$^+$-type source region 3, and each gate electrode 20 extend in the X-direction. The X-direction end portion of each gate electrode 20 is connected with the semiconductor layer 33$s$ of the wiring part 33$b$. The third electrode 33 is thereby electrically connected to the multiple gate electrodes 20.

Comparing FIGS. 1 and 4, it can be seen that the multiple p-type base regions 2 are positioned under the second electrode 32. The p$^+$-type semiconductor region 4 is positioned under the outer perimeter portion of the second electrode 32. The p-type relaxation region 8 is positioned under the pad part 33$a$ and the wiring part 33$b$ of the third electrode 33. The p-type RESURF region 7 is positioned at the periphery of the p$^+$-type semiconductor region 4 and the p-type relaxation region 8.

Operations of the semiconductor device 100 will now be described.

A voltage that is not less than a threshold is applied to the gate electrode 20 in a state in which a positive voltage with respect to the second electrode 32 is applied to the first electrode 31. Thereby, a channel (an inversion layer) is formed in the p-type base region 2; and the semiconductor device 100 is set to the on-state. Electrons flow from the second electrode 32 via the channel toward the n$^-$-type drift region 1 and move toward the first electrode 31. Accordingly, a current flows in the semiconductor device 100. When the voltage applied to the gate electrode 20 drops below the threshold, the channel of the p-type base region 2 disappears, and the semiconductor device 100 is switched to the off-state.

When the semiconductor device 100 is switched to the off-state, depletion layers spread from the p-n junction between the n$^-$-type drift region 1 and the p-type base region 2, between the n$^-$-type drift region 1 and the p$^+$-type semiconductor region 4, etc. The depletion layers spread from the p-n junctions in the Z-direction and spread toward the outer perimeter of the semiconductor device 100. At this time, the electric field intensity easily becomes high at the corner portions of the lower end of the p$^+$-type semiconductor region 4. By providing the p$^+$-type relaxation region 6 around the p$^+$-type semiconductor region 4, the electric field intensity can be relaxed at the vicinity of the corner portions. The electric field intensity at the vicinity of the corner portions of the lower end of the p$^+$-type relaxation region 6 also can be relaxed by providing the p-type RESURF region 5 around the p$^+$-type relaxation region 6. By suppressing the local increase of the electric field intensity, the breakdown voltage of the semiconductor device 100 can be increased.

The p-type relaxation region 8 is provided to relax the electric field intensity between the semiconductor region and the third electrode 33. When the p-type relaxation region 8 is not provided, the third electrode 33 directly faces the n$^-$-type drift region 1 via the insulating layer 25. In such a case, breakdown of the insulating layer 25 may be caused by the potential difference between the n$^-$-type drift region 1 and the third electrode 33. By providing the p-type relaxation region 8, the dielectric breakdown of the insulating layer 25 can be suppressed. By providing the p-type RESURF region 7, the electric field intensity at the vicinity of the corner portions of the lower end of the p-type relaxation region 8 can be relaxed. The breakdown voltage of the semiconductor device 100 can be increased thereby.

The semiconductor device 100 includes parasitic diodes made of the n-type semiconductor regions such as the n$^-$-type drift region 1 and the p-type semiconductor regions such as the p-type base region 2, the p$^+$-type semiconductor region 4, etc. For example, a bridge circuit is configured using the multiple semiconductor devices 100. When one semiconductor device 100 is switched from the on-state to the off-state, the inductance component of the bridge circuit applies a voltage to the second electrode 32 of another semiconductor device 100. The parasitic diodes of the other semiconductor device 100 are caused to operate thereby, and a current flows in the other semiconductor device 100.

Examples of the materials of the components will now be described.

The n$^-$-type drift region 1, the p-type base region 2, the n$^+$-type source region 3, the p$^+$-type semiconductor region 4, the p-type RESURF region 5, the p$^+$-type relaxation region 6, the p-type RESURF region 7, the p-type relaxation region 8, the n$^+$-type drain region 10, the p$^+$-type semiconductor region 11, and the n$^+$-type channel stopper region 12 include silicon carbide as a semiconductor material. Silicon, gallium nitride, or gallium arsenide may be used as the semiconductor material. Arsenic, phosphorus, or antimony can be used as an n-type impurity. Boron can be used as a p-type impurity.

The gate electrode 20 and the semiconductor layer 33$s$ include conductive materials such as polysilicon, etc. An n-type impurity or a p-type impurity may be added to the polysilicon. The gate insulating layer 21 and the insulating layer 25 include insulating materials such as silicon oxide, silicon nitride, silicon oxynitride, etc. The first electrode 31, the second electrode 32, and the metal layer 33$m$ include metals such as titanium, aluminum, etc.

Figure 5:
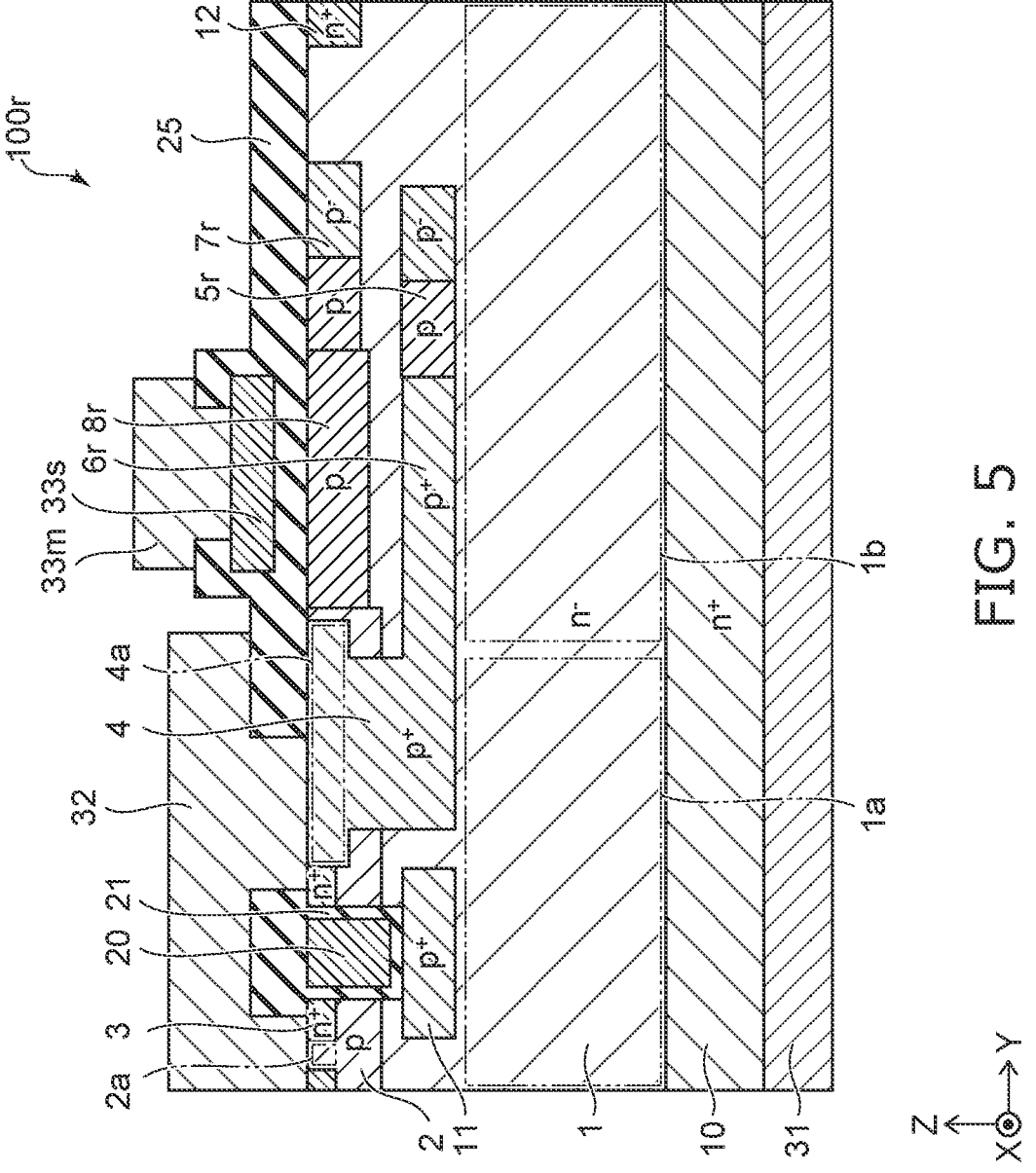
FIG. 5 is a cross-sectional view showing a portion of a semiconductor device according to a reference example.

FIG. 5 is a cross-sectional view showing a portion of a semiconductor device according to a reference example.

The semiconductor device 100$r$ shown in FIG. 5 differs from the semiconductor device 100 in that a p-type RESURF region 5$r$, a p$^+$-type relaxation region 6$r$, a p-type RESURF region 7$r$, and a p-type relaxation region 8$r$ are provided instead of the p-type RESURF region 5, the p$^+$-type relaxation region 6, the p-type RESURF region 7, and the p-type relaxation region 8. The p$^+$-type semiconductor region 4, the p-type RESURF region 5$r$, and the p$^+$-type relaxation region 6$r$ are connected to each other. Also, the p$^+$-type semiconductor region 4, the p-type RESURF region 7$r$, and the p-type relaxation region 8$r$ are connected to each other. Therefore, in the semiconductor device 100$r$, the potentials of the p$^+$-type semiconductor region 4, the p-type RESURF region 5$r$, the p$^+$-type relaxation region 6$r$, the p-type RESURF region 7$r$, and the p-type relaxation region 8$r$ are substantially the same. By providing the p-type RESURF region 5$r$, the p$^+$-type relaxation region 6$r$, the p-type RESURF region 7$r$, and the p-type relaxation region 8$r$, the breakdown voltage of the semiconductor device 100$r$ can be increased.

Advantages of the embodiment will now be described.

In the semiconductor device 100$r$, the p-type base region 2, the p$^+$-type semiconductor region 4, the p-type RESURF region 5$r$, the p$^+$-type relaxation region 6$r$, the p-type RESURF region 7$r$, and the p-type relaxation region 8$r$ function as anodes of parasitic diodes. Due to the wide area of the anode region, the current flows in a wide area when the parasitic diodes operate. In particular, the p-type RESURF region 5r and the p$^+$-type relaxation region 6r are positioned deeper than the p-type RESURF region 7r and the p-type relaxation region 8r and are proximate to the first electrode 31. Also, the area in the X-Y plane of the p-type RESURF region 5r is greater than the area in the X-Y plane of the p$^+$-type semiconductor region 4. A particularly large current flows in the p-type RESURF region 5r when the parasitic diodes operate. The current that flows in the p-type RESURF region 5r and the p$^+$-type relaxation region 6r flows via the p$^+$-type semiconductor region 4 toward the second electrode 32. At this time, the current may concentrate in a portion of the path; and breakdown of the semiconductor device 100r may occur.

In the semiconductor device 100 according to the embodiment, the p$^+$-type semiconductor region 4, the p-type RESURF region 5, and the p$^+$-type relaxation region 6 are separated from each other. When the parasitic diodes of the semiconductor device 100 operate, the operations of the parasitic diodes that include the p-type RESURF region 5 and the p$^+$-type relaxation region 6 as anodes lag behind the parasitic diode that includes the p$^+$-type semiconductor region 4 as an anode. For example, in the normal mode of use of the semiconductor device 100, the parasitic diodes that include the p-type RESURF region 5 and the p$^+$-type relaxation region 6 do not operate; and no current flows in the p-type RESURF region 5 or the p$^+$-type relaxation region 6. Therefore, the flow of a large current from the p-type RESURF region 5 and the p$^+$-type relaxation region 6 toward the p$^+$-type semiconductor region 4 can be suppressed.

On the other hand, when the p-type RESURF region 5 and the p$^+$-type relaxation region 6 do not function as anodes and the p-type RESURF region 7 and the p-type relaxation region 8 are connected with the p$^+$-type semiconductor region 4, a large current flows in the p-type RESURF region 7 and the p-type relaxation region 8. As a result, the current may concentrate in the path from the p-type RESURF region 7 and the p-type relaxation region 8 to the second electrode 32; and breakdown of the semiconductor device 100 may occur. Therefore, in the semiconductor device 100, the p$^+$-type semiconductor region 4, the p-type RESURF region 7, and the p-type relaxation region 8 also are separated from each other. In other words, the operations of the parasitic diodes that include the p-type RESURF region 7 and the p-type relaxation region 8 as anodes also lag behind the parasitic diode that includes the p$^+$-type semiconductor region 4 as the anode. In the normal mode of use of the semiconductor device 100, the parasitic diodes that include the p-type RESURF region 7 and the p-type relaxation region 8 do not operate. The flow of a large current from the p-type RESURF region 7 and the p-type relaxation region 8 toward the p$^+$-type semiconductor region 4 can be suppressed thereby.

Even when the p$^+$-type semiconductor region 4, the p-type RESURF region 5, and the p$^+$-type relaxation region 6 are separated from each other, fluctuation of the potential of the p-type RESURF region 5 and the potential of the p$^+$-type relaxation region 6 can be suppressed by positioning these semiconductor regions proximate to each other. The potential of the p-type RESURF region 5 and the potential of the p$^+$-type relaxation region 6 do not easily have floating states. The electric field intensity at the lower end vicinity of the p$^+$-type semiconductor region 4 can be relaxed by the p$^+$-type relaxation region 6. Also, the electric field intensity at the lower end vicinity of the p$^+$-type relaxation region 6 can be relaxed by the p-type RESURF region 5. As a result, the reduction of the breakdown voltage of the semiconductor device 100 can be suppressed.

Similarly, fluctuation of the potential of the p-type RESURF region 7 and the potential of the p-type relaxation region 8 can be suppressed by positioning the p$^+$-type semiconductor region 4, the p-type RESURF region 7, and the p-type relaxation region 8 proximate to each other. Accordingly, the electric field intensity at the insulating layer 25 can be relaxed by the p-type relaxation region 8. Also, the electric field intensity at the lower end vicinity of the p-type relaxation region 8 can be relaxed by the p-type RESURF region 7. As a result, the reduction of the breakdown voltage of the semiconductor device 100 can be suppressed.

According to the embodiment, breakdown of the semiconductor device 100 when the parasitic diodes operate can be suppressed while suppressing the reduction of the breakdown voltage of the semiconductor device 100.

To further suppress the reduction of the breakdown voltage of the semiconductor device 100, it is favorable for a distance D1 between the p$^+$-type semiconductor region 4 and the p$^+$-type relaxation region 6, a distance D2 between the p$^+$-type relaxation region 6 and the p-type RESURF region 5, a distance D3 between the p$^+$-type semiconductor region 4 and the p-type relaxation region 8, and a distance D4 between the p-type relaxation region 8 and the p-type RESURF region 7 to be not less than 1 μm and not more than 5 μm. FIG. 2 shows the distances D1 to D4.

When the distance D1 is not less than 1 μm and not more than 5 μm, the region of the n$^-$-type drift region 1 between the p$^+$-type semiconductor region 4 and the p$^+$-type relaxation region 6 can be depleted. The p$^+$-type relaxation region 6 is electrically connected with the p$^+$-type semiconductor region 4 via the depletion layer. The fluctuation of the potential of the p$^+$-type relaxation region 6 can be suppressed thereby, and the potential of the p$^+$-type relaxation region 6 can be more stable. Similarly, the potentials of the p$^+$-type relaxation region 6, the p-type RESURF region 7, and the p-type relaxation region 8 can be more stable when the distances D2 to D4 each are not less than 1 μm and not more than 5 μm.

From another perspective, it is favorable for the distance D1 to be equal to or less than the sum of the distance of the depletion layer spreading due to the built-in potential of the p-n junction between the n$^-$-type drift region 1 and the p$^+$-type semiconductor region 4 and the distance of the depletion layer spreading due to the built-in potential of the p-n junction between the n$^-$-type drift region 1 and the p$^+$-type relaxation region 6. When the distance D1 is not more than the sum, the region of the n$^-$-type drift region 1 between the p$^+$-type semiconductor region 4 and the p$^+$-type relaxation region 6 is depleted. The p$^+$-type relaxation region 6 is electrically connected with the p$^+$-type semiconductor region 4 via the depletion layer. The fluctuation of the potential of the p$^+$-type relaxation region 6 can be suppressed thereby, and the potential of the p$^+$-type relaxation region 6 can be more stable.

Similarly, it is favorable for the distance D2 to be equal to or less than the sum of the distance of the depletion layer spreading due to the built-in potential of the p-n junction between the n$^-$-type drift region 1 and the p$^+$-type relaxation region 6 and the distance of the depletion layer spreading due to the built-in potential of the p-n junction between the n$^-$-type drift region 1 and the p-type RESURF region 5. It is favorable for the distance D3 to be equal to or less than the sum of the distance of the depletion layer spreading due to the built-in potential of the p-n junction between the n$^-$-type drift region 1 and the p$^+$-type semiconductor region 4 and the distance of the depletion layer spreading due to the built-in potential of the p-n junction between the n$^-$-type drift region 1 and the p-type relaxation region 8. It is favorable for the distance D4 to be equal to or less than the sum of the distance of the depletion layer spreading due to the built-in potential of the p-n junction between the n$^-$-type drift region 1 and the p-type relaxation region 8 and the distance of the depletion layer spreading due to the built-in potential of the p-n junction between the n$^-$-type drift region 1 and the p-type RESURF region 7.

The embodiment of the invention is particularly favorable for a so-called SiC device in which the semiconductor regions include silicon carbide. In a SiC device, a larger current can flow, and the breakdown voltage can be further increased. When a large current flows in the semiconductor device in the on-state, there is a tendency for a large current to flow when the parasitic diodes operate as well. Therefore, breakdown of the semiconductor device occurs more easily when the parasitic diodes operate. According to the embodiment, the current that flows through the semiconductor device 100 when the parasitic diodes operate can be reduced even when a large current flows in the semiconductor device 100 in the on-state.

First Modification

Figure 6:
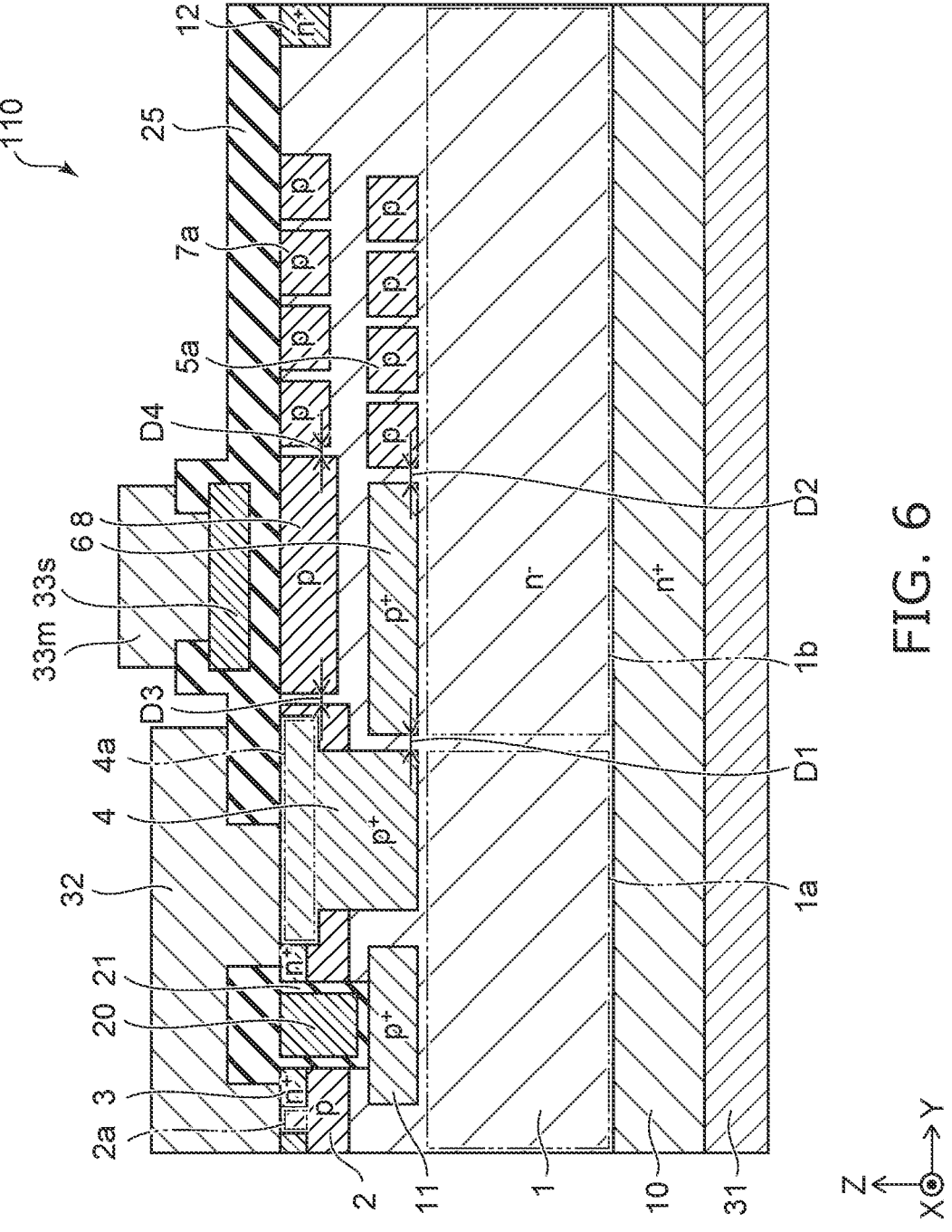
FIG. 6 is a cross-sectional view showing a portion of a semiconductor device according to a first modification of the embodiment.

FIG. 6 is a cross-sectional view showing a portion of a semiconductor device according to a first modification of the embodiment.

The semiconductor device 110 shown in FIG. 6 includes a p-type guard ring region 5a instead of the p-type RESURF region 5. Also, a p-type guard ring region 7a is provided instead of the p-type RESURF region 7.

The p-type guard ring region 5a is located around the p$^+$-type relaxation region 6 along the X-Y plane. Multiple p-type guard ring regions 5a are arranged in the direction from the first part 1a toward the second part 1b. The multiple p-type guard ring regions 5a are separated from the p$^+$-type relaxation region 6 and separated from each other.

The p-type guard ring region 7a is located around the p-type relaxation region 8 along the X-Y plane. Multiple p-type guard ring regions 7a are arranged in the direction from the first part 1a toward the second part 1b. The multiple p-type guard ring regions 7a are separated from the p-type relaxation region 8 and the n$^+$-type channel stopper region 12 and separated from each other.

By providing the multiple p-type guard ring regions 5a, the electric field intensity at the vicinity of the corner portions of the lower end of the p$^+$-type relaxation region 6 can be relaxed. By providing the multiple p-type guard ring regions 7a, the electric field intensity at the vicinity of the corner portions of the lower end of the p-type relaxation region 8 can be relaxed. According to the first modification, similarly to the embodiment described above, the breakdown of the semiconductor device 110 when the parasitic diodes operate can be suppressed while suppressing the reduction of the breakdown voltage of the semiconductor device 110.

Second Modification

Figure 7:
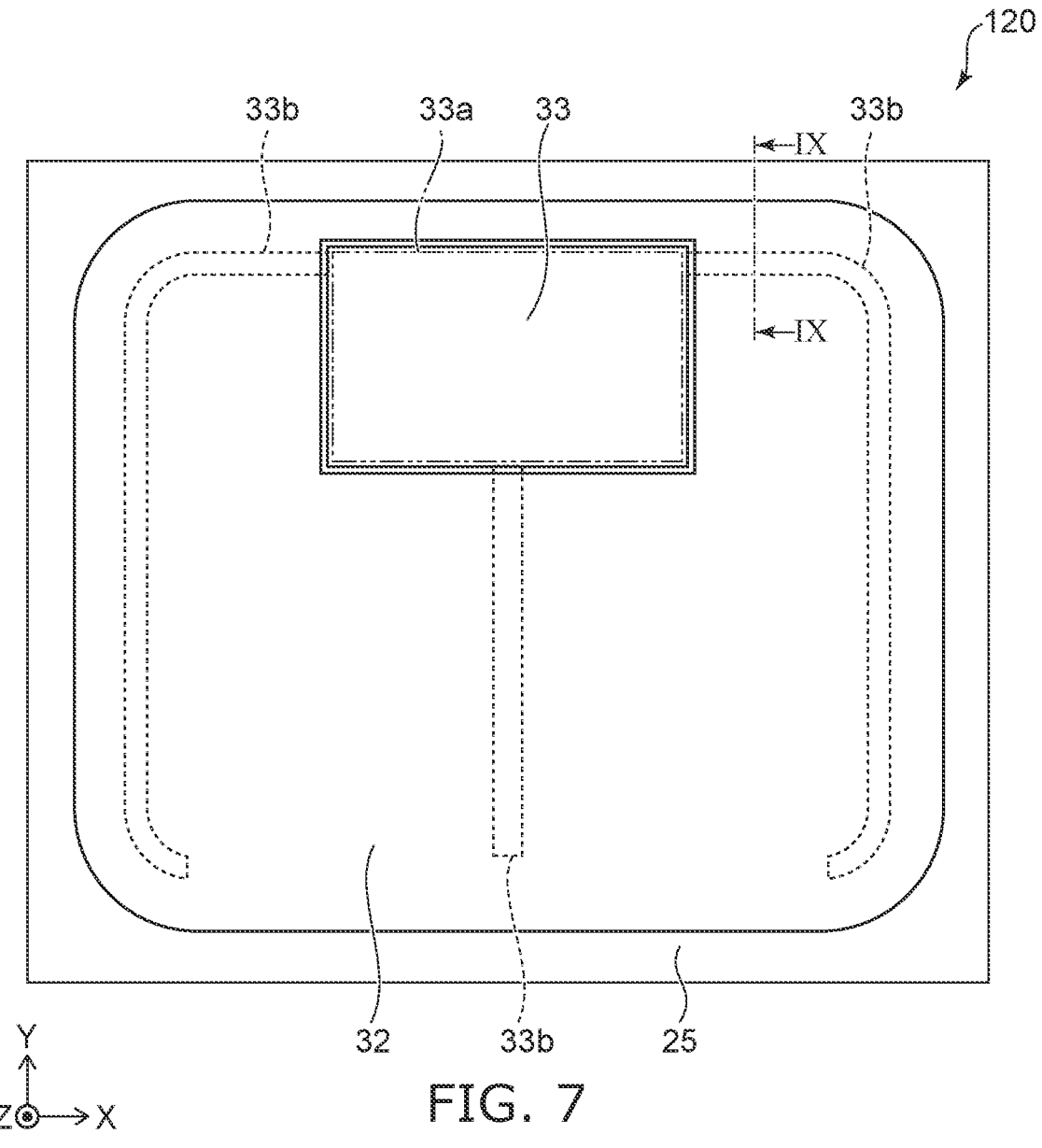
FIG. 7 is a plan view showing a semiconductor device according to a second modification of the embodiment.
Figure 8:
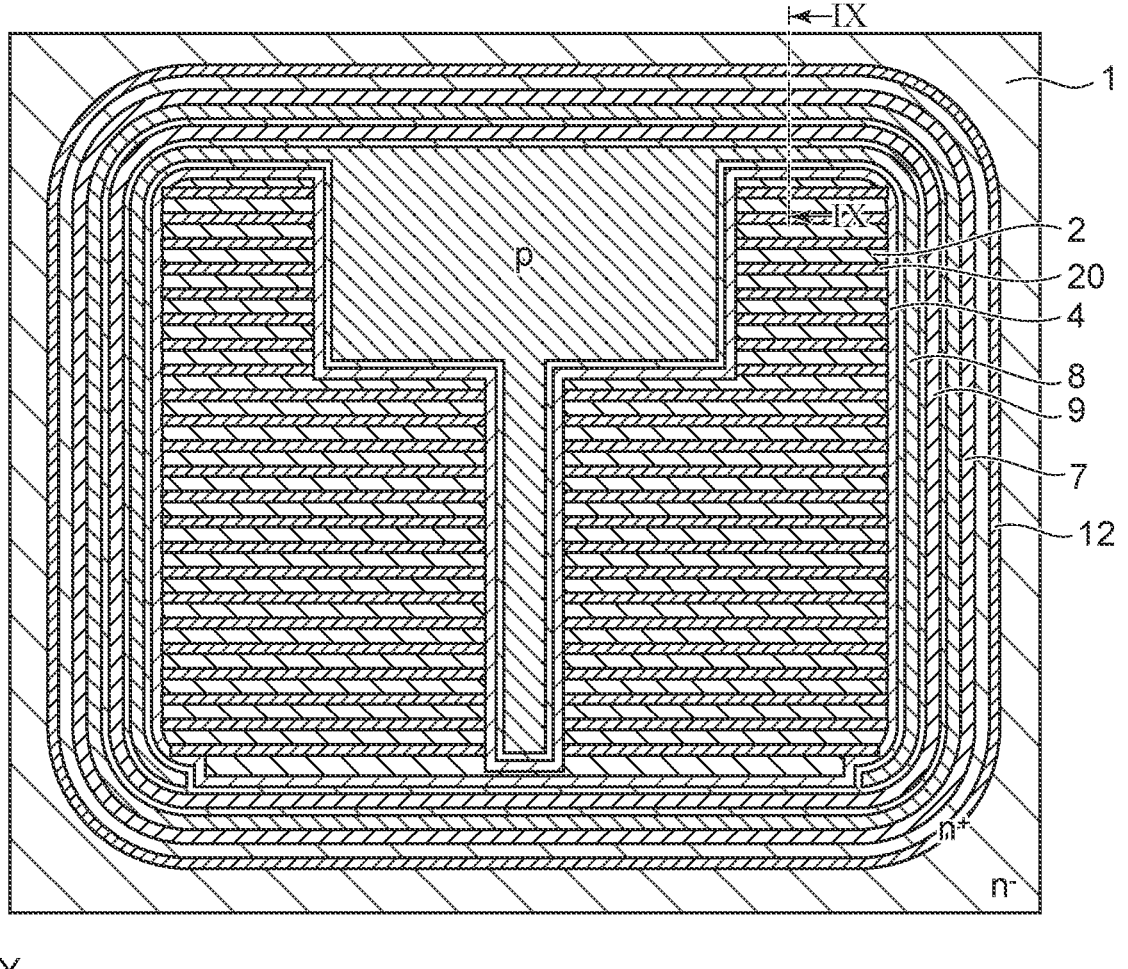
FIG. 8 is a plan view showing the semiconductor device according to the second modification of the embodiment.
Figure 9:
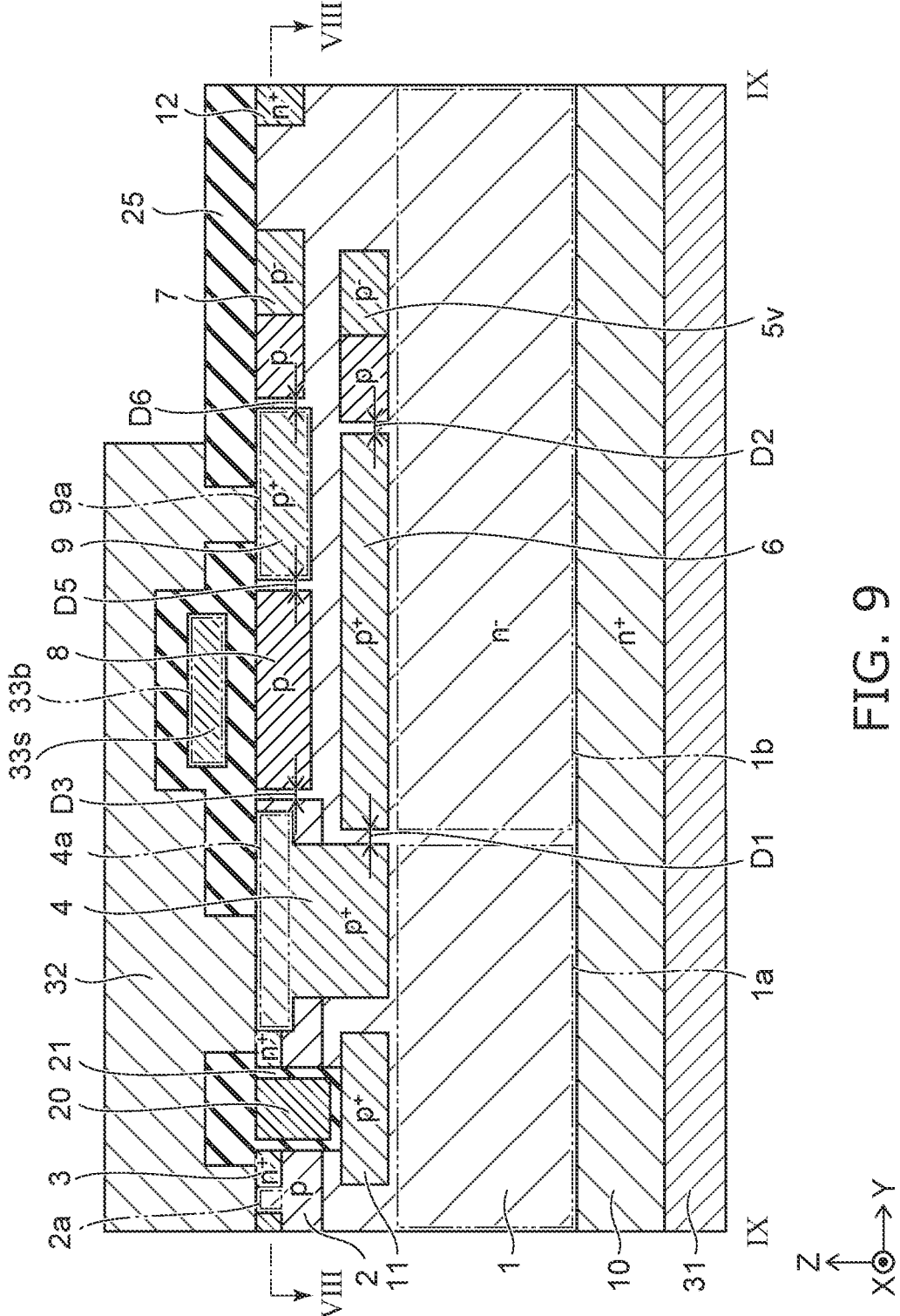
FIG. 9 is a IX-IX cross-sectional view of FIGS. 7 and 8.

FIGS. 7 and 8 are plan views showing a semiconductor device according to a second modification of the embodiment. FIG. 9 is a IX-IX cross-sectional view of FIGS. 7 and 8. The wiring part 33b of the third electrode 33 is illustrated by broken lines in FIG. 7. The n$^+$-type source region 3 and the gate insulating layer 21 are not illustrated in FIG. 8. FIG. 8 corresponds to a VIII-VIII cross-sectional view of FIG. 9.

In the semiconductor device 120 according to the second modification as shown in FIG. 7, the wiring part 33b of the third electrode 33 is located under the second electrode 32. As shown in FIG. 9, the wiring part 33b includes only the semiconductor layer 33s, and does not include the metal layer 33m.

As shown in FIGS. 8 and 9, compared to the semiconductor device 100, the semiconductor device 120 further includes a p$^+$-type semiconductor region 9. The p$^+$-type semiconductor region 9 is located between the p-type RESURF region 7 and the p-type relaxation region 8 and is separated from the p-type RESURF region 7 and the p-type relaxation region 8.

The p-type impurity concentration of the p$^+$-type semiconductor region 9 is greater than the p-type impurity concentrations of the p-type RESURF region 7 and the p-type relaxation region 8. A contact portion 9a is provided in the upper portion of the p$^+$-type semiconductor region 9. The contact portion 9a is illustrated by a double dot-dash line. The p-type impurity concentration of the contact portion 9a is greater than the p-type impurity concentration of the other portions of the p$^+$-type semiconductor region 9.

A portion of the second electrode 32 is located on the p$^+$-type semiconductor region 9. The second electrode 32 contacts the contact portion 9a and is electrically connected with the p$^+$-type semiconductor region 9.

When the parasitic diodes of the semiconductor device 120 operate, the p-type base region 2, the p$^+$-type semiconductor region 4, and the p$^+$-type semiconductor region 9 function as anodes. The p$^+$-type semiconductor region 9 is separated from the p-type RESURF region 7 and the p-type relaxation region 8. Therefore, according to the semiconductor device 120 according to the second modification, similarly to the semiconductor device 100, the flow of a large current from the p-type RESURF region 7 and the p-type relaxation region 8 toward the second electrode 32 can be suppressed.

According to the semiconductor device 120, the p-type relaxation region 8 is positioned between the p$^+$-type semiconductor region 4 and the p$^+$-type semiconductor region 9. Compared to the semiconductor device 100, the potential of the p-type relaxation region 8 can be more stable. Therefore, the dielectric breakdown of the insulating layer 25 can be further suppressed.

It is favorable for a distance D5 between the p-type relaxation region 8 and the p$^+$-type semiconductor region 9 and a distance D6 between the p$^+$-type semiconductor region 9 and the p-type RESURF region 7 to be not less than 1 μm and not more than 5 μm. FIG. 9 shows the distances D5 and D6. When the distances D5 and D6 each are not less than 1 μm and not more than 5 μm, the potentials of the p-type RESURF region 7 and the p-type relaxation region 8 can be more stable.

From another perspective, it is favorable for the distance D5 to be equal to or less than the sum of the distance of the depletion layer spreading due to the built-in potential of the p-n junction between the n$^-$-type drift region 1 and the p-type relaxation region 8 and the distance of the depletion layer spreading due to the built-in potential of the p-n junction between the n$^-$-type drift region 1 and the p$^+$-type semiconductor region 9. It is favorable for the distance D6 to be equal to or less than the sum of the distance of the depletion layer spreading due to the built-in potential of the p-n junction between the n$^-$-type drift region 1 and the p$^+$-type semiconductor region 9 and the distance of the depletion layer spreading due to the built-in potential between the n$^-$-type drift region 1 and the p-type RESURF region 7. According to the relationship of these distances, the potentials of the p-type RESURF region 7 and the p-type relaxation region 8 can be more stable.

Embodiments of the invention include the following configurations.

(Configuration 1)

A semiconductor device, comprising:

a first electrode;

a first semiconductor region located on the first electrode, the first semiconductor region being of a first conductivity type, the first semiconductor region including a first part, and a second part located around the first part along a first plane perpendicular to a first direction, the first direction being from the first electrode toward the first semiconductor region;

a second semiconductor region located on the first part, the second semiconductor region being of a second conductivity type;

a third semiconductor region located on the second semiconductor region, the third semiconductor region being of the first conductivity type;

a gate electrode facing the second semiconductor region via a gate insulating layer in a second direction perpendicular to the first direction;

a fourth semiconductor region located around the second semiconductor region and the gate electrode along the first plane on the first part, the fourth semiconductor region being of the second conductivity type, a lower end of the fourth semiconductor region being positioned deeper than a lower end of the second semiconductor region;

a fifth semiconductor region positioned on the second part and located around a portion of the fourth semiconductor region along the first plane, the fifth semiconductor region being of the second conductivity type;

a sixth semiconductor region located between the fifth semiconductor region and the portion of the fourth semiconductor region, the sixth semiconductor region being separated from the fourth and fifth semiconductor regions, the sixth semiconductor region being of the second conductivity type;

a seventh semiconductor region positioned higher than the fifth semiconductor region and located around an other portion of the fourth semiconductor region along the first plane, the seventh semiconductor region being separated from the fifth semiconductor region, the seventh semiconductor region being of the second conductivity type;

an eighth semiconductor region located between the seventh semiconductor region and the other portion of the fourth semiconductor region, the eighth semiconductor region being separated from the fourth, sixth, and seventh semiconductor regions, the eighth semiconductor region being of the second conductivity type;

a second electrode located on the second, third, and fourth semiconductor regions; and a third electrode located on the eighth semiconductor region with an insulating layer interposed, the third electrode being separated from the second electrode and electrically connected with the gate electrode.

(Configuration 2)

The device according to Configuration 1, wherein the third electrode includes:

a wiring part including a portion extending in the second direction; and a pad part, the pad part being longer in a third direction than the portion extending in the second direction, the third direction being perpendicular to the first and second directions, and the eighth semiconductor region is positioned under the pad part and the wiring part.

(Configuration 3)

The device according to Configuration 1 or 2, wherein a distance between the fourth semiconductor region and the sixth semiconductor region and a distance between the fifth semiconductor region and the sixth semiconductor region each are not less than 1 µm and not more than 5 µm.

(Configuration 4)

The device according to Configuration 1 or 2, wherein a distance between the fourth semiconductor region and the sixth semiconductor region is not more than a sum of a distance of a depletion layer spreading due to a built-in voltage of a p-n junction between the first semiconductor region and the fourth semiconductor region and a distance of a depletion layer spreading due to a built-in voltage of a p-n junction between the first semiconductor region and the sixth semiconductor region, and a distance between the fifth semiconductor region and the sixth semiconductor region is not more than a sum of a distance of a depletion layer spreading due to a built-in voltage of a p-n junction between the first semiconductor region and the fifth semiconductor region and the distance of the depletion layer spreading due to the built-in voltage of the p-n junction between the first semiconductor region and the sixth semiconductor region.

(Configuration 5)

The device according to any one of Configurations 1 to 4, wherein a distance between the fourth semiconductor region and the eighth semiconductor region and a distance between the seventh semiconductor region and the eighth semiconductor region each are not less than 1 µm and not more than 5 µm.

(Configuration 6)

The device according to any one of Configurations 1 to 4, wherein a distance between the fourth semiconductor region and the eighth semiconductor region is not more than a sum of a distance of a depletion layer spreading due to a built-in voltage of a p-n junction between the first semiconductor region and the fourth semiconductor region and a distance of a depletion layer spreading due to a built-in voltage of a p-n junction between the first semiconductor region and the eighth semiconductor region, and a distance between the seventh semiconductor region and the eighth semiconductor region is not more than a sum of a distance of a depletion layer spreading due to a built-in voltage of a p-n junction between the first semiconductor region and the seventh semiconductor region and the distance of the depletion layer spreading due to the built-in voltage of the p-n junction between the first semiconductor region and the eighth semiconductor region.

(Configuration 7)

The device according to any one of Configurations 1 to 6, further comprising:

a ninth semiconductor region located between the seventh semiconductor region and the eighth semiconductor region, the ninth semiconductor region being of the second conductivity type, the ninth semiconductor region being separated from the seventh and eighth semiconductor regions, a portion of the second electrode being located on the ninth semiconductor region.

(Configuration 8)

The device according to any one of Configurations 1 to 7, wherein the first to eighth semiconductor regions include silicon carbide.

According to the embodiments described above, breakdown of semiconductor devices when the parasitic diodes operate can be suppressed.

In the embodiments, the relative level of impurity concentration between the semiconductor regions can be confirmed by, for example, using SCM (Scanning Capacitance Microscope). The carrier concentration in each semiconductor region can be considered equal to the concentration of impurities activated in each semiconductor region. Accordingly, the relative level of the carrier concentration between the semiconductor regions can also be confirmed using the SCM. Also, the impurity concentration in each semiconductor region can be measured by, for example, SIMS (Secondary Ion Mass Spectrometry).

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention. Moreover, above-mentioned embodiments can be combined mutually and can be carried out.

What is claimed is:

1. A semiconductor device, comprising:

a first electrode;

a first semiconductor region located on the first electrode, the first semiconductor region being of a first conductivity type, the first semiconductor region including a first part, and a second part located around the first part along a first plane perpendicular to a first direction, the first direction being from the first electrode toward the first semiconductor region;

a second semiconductor region located on the first part, the second semiconductor region being of a second conductivity type;

a third semiconductor region located on the second semiconductor region, the third semiconductor region being of the first conductivity type;

a gate electrode facing the second semiconductor region via a gate insulating layer in a second direction perpendicular to the first direction;

a fourth semiconductor region located around the second semiconductor region and the gate electrode along the first plane on the first part, the fourth semiconductor region being of the second conductivity type, a lower end of the fourth semiconductor region being positioned deeper than a lower end of the second semiconductor region;

a fifth semiconductor region positioned on the second part and located around an outer periphery of a portion of the fourth semiconductor region along the first plane, the fifth semiconductor region being of the second conductivity type;

a sixth semiconductor region located between the fifth semiconductor region and the portion of the fourth semiconductor region, the sixth semiconductor region being separated from the fourth and fifth semiconductor regions, the sixth semiconductor region being of the second conductivity type, the fourth semiconductor region being located between the gate electrode and the sixth semiconductor region;

a seventh semiconductor region positioned higher than the fifth semiconductor region and located around an outer periphery of an other portion of the fourth semiconductor region along the first plane, the seventh semiconductor region being separated from the fifth semiconductor region, the seventh semiconductor region being of the second conductivity type;

an eighth semiconductor region located between the seventh semiconductor region and the other portion of the fourth semiconductor region, the eighth semiconductor region being separated from the fourth, sixth, and seventh semiconductor regions, the eighth semiconductor region being of the second conductivity type;

a second electrode located on the second, third, and fourth semiconductor regions; and a third electrode located on the eighth semiconductor region with an insulating layer interposed, the third electrode being separated from the second electrode and electrically connected with the gate electrode.

2. The device according to claim 1, wherein the third electrode includes:

a wiring part including a portion extending in the second direction; and a pad part, the pad part being longer in a third direction than the portion extending in the second direction, the third direction being perpendicular to the first and second directions, and the eighth semiconductor region is positioned under the pad part and the wiring part.

3. The device according to claim 2, wherein the wiring part is positioned on the second part.

4. The device according to claim 2, wherein a plurality of the wiring parts is provided, and at least a portion of the second electrode is positioned between one of the plurality of wiring parts and an other one of the plurality of wiring parts in the third direction.

5. The device according to claim 4, wherein each of the plurality of wiring parts is connected to the pad part at one end, and each of the plurality of wiring parts is separated from each other in the third direction at an other end.

6. The device according to claim 2, wherein a plurality of the wiring parts is provided, a portion of the second electrode is positioned between one of the plurality of wiring parts and an other one of the plurality of wiring parts in the third direction, and an other portion of the second electrode is positioned on the plurality of wiring parts.

7. The device according to claim 1, wherein a distance between the fourth semiconductor region and the sixth semiconductor region and a distance between the fifth semiconductor region and the sixth semiconductor region each are not less than 1 μm and not more than 5 μm.

8. The device according to claim 1, wherein a distance between the fourth semiconductor region and the sixth semiconductor region is not more than a sum of a distance of a depletion layer spreading due to a built-in voltage of a p-n junction between the first semiconductor region and the fourth semiconductor region and a distance of a depletion layer spreading due to a built-in voltage of a p-n junction between the first semiconductor region and the sixth semiconductor region, and a distance between the fifth semiconductor region and the sixth semiconductor region is not more than a sum of a distance of a depletion layer spreading due to a built-in voltage of a p-n junction between the first semiconductor region and the fifth semiconductor region and the distance of the depletion layer spreading due to the built-in voltage of the p-n junction between the first semiconductor region and the sixth semiconductor region.

9. The device according to claim 1, wherein a distance between the fourth semiconductor region and the eighth semiconductor region and a distance between the seventh semiconductor region and the eighth semiconductor region each are not less than 1 μm and not more than 5 μm.

10. The device according to claim 1, wherein a distance between the fourth semiconductor region and the eighth semiconductor region is not more than a sum of a distance of a depletion layer spreading due to a built-in voltage of a p-n junction between the first semiconductor region and the fourth semiconductor region and a distance of a depletion layer spreading due to a built-in voltage of a p-n junction between the first semiconductor region and the eighth semiconductor region, and a distance between the seventh semiconductor region and the eighth semiconductor region is not more than a sum of a distance of a depletion layer spreading due to a built-in voltage of a p-n junction between the first semiconductor region and the seventh semiconductor region and the distance of the depletion layer spreading due to the built-in voltage of the p-n junction between the first semiconductor region and the eighth semiconductor region.

11. The device according to claim 1, further comprising:

a ninth semiconductor region located between the seventh semiconductor region and the eighth semiconductor region, the ninth semiconductor region being of the second conductivity type, the ninth semiconductor region being separated from the seventh and eighth semiconductor regions, a portion of the second electrode being located on the ninth semiconductor region.

12. The device according to claim 1, wherein a plurality of the gate electrodes is provided on the first part.

13. The device according to claim 1, wherein the first to eighth semiconductor regions include silicon carbide.

14. The device according to claim 1, wherein the fifth semiconductor region is separated from the fourth semiconductor region.

* * * * *